(12) United States Patent
Minnich et al.

(10) Patent No.: US 10,043,688 B1
(45) Date of Patent: Aug. 7, 2018

(54) METHOD FOR MOUNT TAPE DIE RELEASE SYSTEM FOR THIN DIE EJECTION

(71) Applicant: Micron Technology, Inc., Boise, ID (US)

(72) Inventors: Jeremy E. Minnich, Boise, ID (US); Brandon P. Wirz, Boise, ID (US); Bret K. Street, Meridian, ID (US); James M. Derderian, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 15/867,071

(22) Filed: Jan. 10, 2018

(51) Int. Cl.
  *B32B 43/00* (2006.01)
  *H01L 21/67* (2006.01)
  *H01L 21/683* (2006.01)

(52) U.S. Cl.
  CPC ...... *H01L 21/67132* (2013.01); *B32B 43/006* (2013.01); *H01L 21/6836* (2013.01); *B32B 2457/00* (2013.01); *H01L 2221/68318* (2013.01); *H01L 2221/68381* (2013.01); *Y10S 156/931* (2013.01); *Y10S 156/941* (2013.01); *Y10T 156/1126* (2015.01); *Y10T 156/1142* (2015.01); *Y10T 156/1184* (2015.01); *Y10T 156/1928* (2015.01)

(58) Field of Classification Search
  CPC ....... H01L 21/6836; H01L 2221/68318; H01L 2221/68381; Y10T 156/1126; Y10T 156/1928; Y10T 156/1184; Y10S 156/931; Y10S 156/941; B32B 43/006
  See application file for complete search history.

(56) References Cited

U.S. PATENT DOCUMENTS

| | | | | |
|---|---|---|---|---|
| 2009/0242124 | A1* | 10/2009 | Konno | H01L 21/67011 156/716 |
| 2015/0214088 | A1* | 7/2015 | Nakao | H01L 21/67132 156/707 |
| 2015/0279716 | A1* | 10/2015 | Ko | H01L 21/6836 156/716 |

* cited by examiner

*Primary Examiner* — Mark A Osele
(74) *Attorney, Agent, or Firm* — Parsons Behle & Latimer

(57) ABSTRACT

An apparatus, system, and a method of using the apparatus or system that includes a bladder positioned between tape and an adhesive layer configured to selectively connect the tape to a semiconductor device. The bladder includes one or more chambers that may be selectively expanded to move a portion of the bladder and adhesive layer away from the tape, which may enable the removal of the semiconductor device. The flow of fluid into each of the chambers may selectively expand the chambers. The chambers may have a substantially rounded upper profile or a substantially pointed upper profile. A material within the chambers may be heated to expand the chambers. A plurality of conduits may permit the flow of fluid into the chambers. The conduits may be inserted into the bladder. The chambers may be collapsed after expansion to enable the removal of a semiconductor device from the tape.

23 Claims, 3 Drawing Sheets

METHOD FOR MOUNT TAPE DIE RELEASE SYSTEM FOR THIN DIE EJECTION

FIELD

The embodiments described herein relate to an apparatus, system, and a method of using the apparatus or system that includes a bladder positioned between tape and an adhesive layer configured to selectively connect the tape to a semiconductor device. The bladder includes one or more chambers that may be selectively expanded to move a portion of the bladder and adhesive layer away from the tape, which may enable the removal of the semiconductor device.

BACKGROUND

A semiconductor device may include a plurality of semiconductor devices formed on a single substrate. For example, a semiconductor wafer may include a plurality of die that may be processed to form a plurality of semiconductor devices from a single semiconductor wafer. Various processes may be used to separate the semiconductor device into a plurality of semiconductor devices.

For example, stealth dicing through tape may be used to separate the semiconductor wafer into a plurality of semiconductor devices. The semiconductor device typically may comprise a circuitry layer positioned on a silicon layer. The circuitry layer comprising the top surface and the silicon layer comprising the bottom surface. The backside or bottom surface of the semiconductor wafer is applied to a tape material. Various tape materials may be used such as Lintec D-L01wtest38 tape, Lintec D-175, and/or Nitto PF-04.

Various methods may be used to form a plurality of semiconductor devices from a single semiconductor wafer mounted to tape material. For example, an infrared laser cleaves a portion of the silicon layer of the semiconductor wafer and a tape expander machine is then used to apply an expanding force to the tape material causing the silicon lattice to break apart where the infrared laser has cleaved it. Alternatively, the single semiconductor wafer could be formed into a plurality of semiconductor devices mechanically, by etching, by lasing, and/or by other methods.

Semiconductor processing and packaging techniques continue to evolve to meet industry demands for increased performance and reduced size. Electronic products, such as cell phones, smart phones, tablets, personal digital assistances, laptop computers, as well as other electronic devices, require packaged semiconductor assemblies having a high density of devices while having a relatively small footprint. The thickness of semiconductor wafers may be reduced to minimize the size of semiconductor devices, i.e. dies. As the thickness of the semiconductor device decreases, the device may be more fragile and it may be more difficult to remove from the tape. As an example, it may be difficult to remove a semiconductor die having a thickness of under 50 microns from the tape without potentially damaging the device.

Additional drawbacks and disadvantages may exist.

Figure 1:
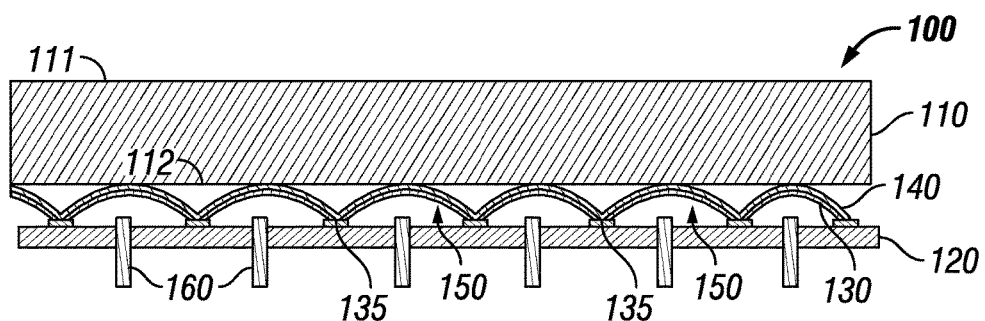
FIG. 1 is a cross-section schematic of an embodiment of a system that may be used to remove a semiconductor device from tape.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure as defined by the appended claims.

DETAILED DESCRIPTION

In this disclosure, numerous specific details are discussed to provide a thorough and enabling description for embodiments of the present disclosure. One of ordinary skill in the art will recognize that the disclosure can be practiced without one or more of the specific details. Well-known structures and/or operations often associated with semiconductor devices may not be shown and/or may not be described in detail to avoid obscuring other aspects of the disclosure. In general, it should be understood that various other devices, systems, and/or methods in addition to those specific embodiments disclosed herein may be within the scope of the present disclosure.

The term "semiconductor device assembly" can refer to an assembly of one or more semiconductor devices, semiconductor device packages, and/or substrates, which may include interposers, supports, and/or other suitable substrates. The semiconductor device assembly may be manufactured as, but not limited to, discrete package form, strip or matrix form, and/or wafer panel form. The term "semiconductor device" generally refers to a solid-state device that includes semiconductor material. A semiconductor device can include, for example, a semiconductor substrate, wafer, panel, or a single die from a wafer or substrate. A semiconductor device may refer herein to a semiconductor die, but semiconductor devices are not limited to semiconductor dies.

As used herein, the terms "vertical," "lateral," "upper," and "lower" can refer to relative directions or positions of features in the semiconductor devices and/or semiconductor device assemblies shown in the Figures. For example, "upper" or "uppermost" can refer to a feature positioned closer to the top of a page than another feature. These terms, however, should be construed broadly to include semiconductor devices and/or semiconductor device assemblies having other orientations, such as inverted or inclined orientations where top/bottom, over/under, above/below, up/down, and left/right can be interchanged depending on the orientation.

Various embodiments of this disclosure are directed to apparatus, systems, and methods of removing a semiconductor device from tape. In one embodiment of the disclosure, an apparatus comprises tape, an adhesive layer configured to selectively connect the tape to a semiconductor device, and a bladder positioned between the tape and the adhesive layer. The bladder includes a plurality of chambers configured to be selectively expanded. The expansion of the chambers moves a portion of the bladder, as well as a portion of the adhesive layer, away from the tape, which may enable the removal of a semiconductor device from the tape, bladder, and adhesive layer assembly.

One embodiment is a system comprising tape, an adhesive layer configured to selectively connect the tape to a semiconductor device, and a bladder positioned between the tape and the adhesive layer. The bladder includes a plurality of chambers configured to be selectively expanded. The system includes a plurality of conduits configured to provide a fluid to expand each of the chambers. The expansion of the chambers moves a portion of the bladder as well as a portion of the adhesive layer away from the tape, which may enable the removal of a semiconductor device from the tape, bladder, and adhesive layer assembly.

One embodiment is a method of removing a semiconductor device from tape that comprises providing a bladder between tape and an adhesive layer that selectively attaches the semiconductor device to the tape. The method includes expanding a chamber within the bladder that moves the semiconductor device away from the tape, which may enable the removal of a semiconductor device from the tape, bladder, and adhesive layer assembly. The method may include removing the semiconductor device from the tape.

FIG. 1 is a cross-section schematic of an embodiment of a system 100 that may be used to remove a semiconductor device 110 from tape 120. The semiconductor device 110 has a first or top surface 111 and a second or bottom surface 112. The bottom surface 112 of the semiconductor device 110 is attached to tape 120 via an adhesive layer 140. The semiconductor device 110 may be a silicon wafer and may comprise a plurality of semiconductor devices, such as individual dies. The tape 120 may be expanded to break the semiconductor device 110 into a plurality of semiconductor devices, as discussed herein. After separating the semiconductor device 110 into a plurality of individual semiconductor devices, it may be difficult to remove the individual semiconductor devices from the tape 120 without potentially damaging the devices. In FIG. 1, a single semiconductor device 110 is shown for clarity. As discussed herein, various methods may be used to form a plurality of semiconductor devices from a semiconductor device 110 attached to tape 120. It may be difficult to remove the semiconductor device 110 from the tape 120 regardless of the processing method. If the thickness of the semiconductor device 110 is less than 50 microns, it may be difficult to remove from the tape without potentially damaging the semiconductor device 110.

The system 100 includes a bladder 130 positioned between the adhesive layer 140 and the tape 120. The bladder 130 includes a plurality of chambers 150 that may be selectively expanded to aid in the removal of the semiconductor devices. The chambers 150 may be created by the thermal bonding 135 of portions of the bladder 130 to the tape 120. The chambers 150 may be configured to have a substantially rounded upper profile when expanded, as shown in FIG. 1. The expansion of the chambers 150 moves portions of the adhesive layer 140 and bladder 130 away from the tape 120. Thus, the semiconductor device 110, or individual semiconductor devices, also moves away from the tape 120, which may enable the removal of the semiconductor device 110, or individual semiconductor devices, from the tape.

The chambers 150 of the bladder 130 may be selectively expanded by various mechanisms and/or methods. For example, conduits 160, such as a capillary needle, may be inserted through the tape 120 to provide fluid communication with each chamber 150 of the bladder 130. Fluid may flow through the conduits 160 to selectively expand the chambers 150 moving the semiconductor device 110 away from the tape 120. Various fluids may be used to expand the chambers 150 as would be appreciated by one of ordinary skill in the art having the benefit of this disclosure. For example, the fluid may be, but is not limited to, air, nitrogen, oxygen, or a combination thereof. Other fluids may be used. After the expansion of the chambers 150, the chambers 150 may then be collapsed prior to the removal of the semiconductor device 110. Alternatively, the chambers 150 may be cycled between an expanded state and a collapsed state to enable the removal of the semiconductor device 110 from the tape 120, bladder 130, and adhesive layer 140 assembly.

The number, size, shape, and/or configuration of the tape 120, bladder 130, adhesive layer 140, semiconductor device 110, chambers 150, bonded portions of the bladder 135, and/or conduits 160 are shown for illustrative purposes and may be varied depending on the application as would be appreciated by one of ordinary skill in the art having the benefit of this disclosure. For example, each chamber 150 of the bladder 130 may not need to be expanded to facilitate the removal of a semiconductor device 110 from the tape 120. Further, the system 100 may include a plurality of chambers 150 per semiconductor device 110 or the system 100 may be configured to have a single chamber 150 for each semiconductor device 110.

Figure 2:
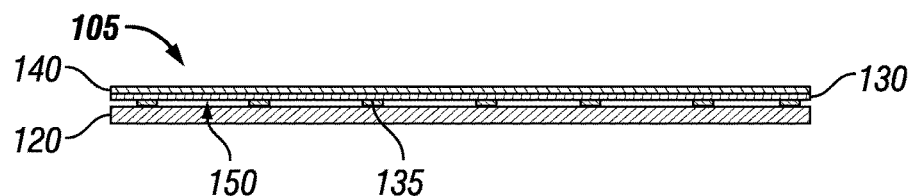
FIG. 2 is a cross-section schematic of an embodiment of an assembly of tape, bladder, and an adhesive layer with the bladder being positioned between tape and an adhesive layer.

FIG. 2 shows a schematic of an apparatus 105 that is comprised of a bladder 130 positioned between an adhesive layer 140 and tape 120. As discussed herein, the adhesive layer 140 is configured to selectively attach a semiconductor device 110 (not shown in FIG. 2) to the apparatus 105. The bladder 130 includes a plurality of chambers 150, which may be separated by portions 135 of the bladder 130 that are connected to the tape 120. FIG. 2 shows the chambers 150 of the bladder 130 in a collapsed unexpanded state.

Figure 3:
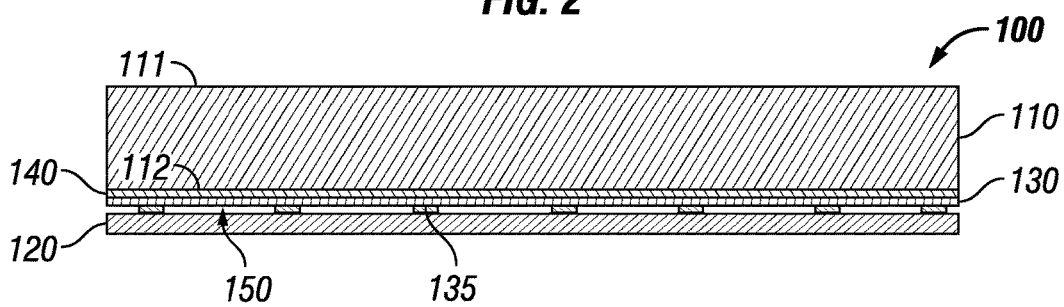
FIG. 3 is a cross-section schematic of an embodiment of a system that may be used to remove a semiconductor device from tape with chambers within the bladder in a collapsed state.

FIG. 3 shows a schematic of a system 100 with a semiconductor device 110 connected to the apparatus or assembly 105 of FIG. 2. The semiconductor device 110 has a top surface 111 and a bottom surface 112. The bottom surface 112 is connected to the apparatus 105 of FIG. 2 via the adhesive layer 140. Various adhesives may be used to form the adhesive layer 140 as would be appreciated by one of ordinary skill in the art having the benefit of this disclosure. For example, the adhesive may be configured to release the semiconductor device 110 by the application of ultraviolet light, thermal energy, and/or mechanical force.

Figure 4:
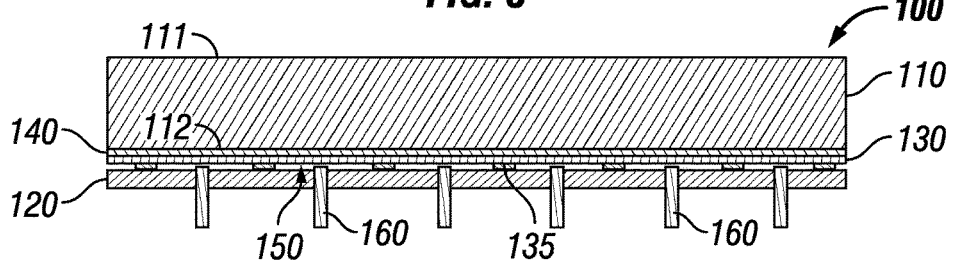
FIG. 4 is a cross-section schematic of an embodiment of a system that may be used to remove a semiconductor device from tape with conduits inserted to be in communication with chambers within the bladder.

FIG. 4 shows a schematic of the system of FIG. 3 with conduits 160 inserted through the tape 160 to provide communication with the chambers 150 of the bladder 130. FIG. 4 shows the chambers 150 in a collapsed or unexpanded state. Fluid may flow through the conduits 160 to expand the chambers 150, as shown in FIG. 1. The conduits 160 may also be used to collapse the chamber 150 after expansion. For example, the fluid from expanded chambers 150 may be withdrawn from the chambers 150 via the conduits 160. If necessary, the chambers 150 may be cycled between an expanded state and a collapsed state to aid in the removal of a semiconductor device 110 from the tape 120.

Figure 5:
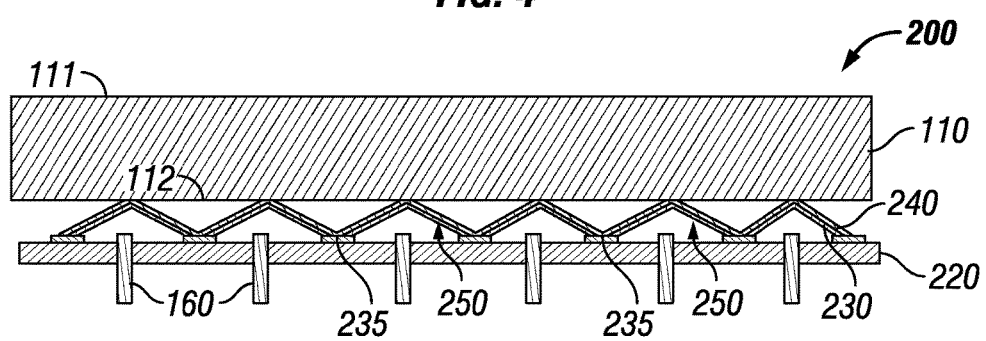
FIG. 5 is a cross-section schematic of an embodiment of a system that may be used to remove a semiconductor device from tape.

FIG. 5 is a cross-section schematic of an embodiment of a system 200 that may be used to remove a semiconductor device 110 from tape 220. The semiconductor device 110 has a first or top surface 111 and a second or bottom surface 112, which is attached to tape 220 via an adhesive layer 240. As discussed herein, the tape 220 may be expanded to break the semiconductor device 110 into a plurality of semiconductor devices. After separating the semiconductor device 110 into a plurality of individual semiconductor devices, it may be difficult to remove from the tape 220 without potentially damaging the devices. In FIG. 5, a single semiconductor device 110 is shown for clarity.

The system 200 includes a bladder 230 positioned between the adhesive layer 240 and the tape 220. The bladder 230 includes a plurality of chambers 250 that may be selectively expanded to aid in the removal of the semiconductor devices. As discussed herein, walls of the chambers 250 may be connected as shown at 235 to the tape 220. The chambers 250 may be configured to have a substantially pointed upper profile when expanded, as shown in FIG. 5. For example, the expanded chamber 250 may be substantially triangular in shape, which may enable the removal of the semiconductor device 110. The substantially pointed upper profile of the expanded chamber 250 may provide less contact area with the adhesive layer 240 with the semiconductor device 110, which may enable the removal of the semiconductor device 110.

Figure 6A:
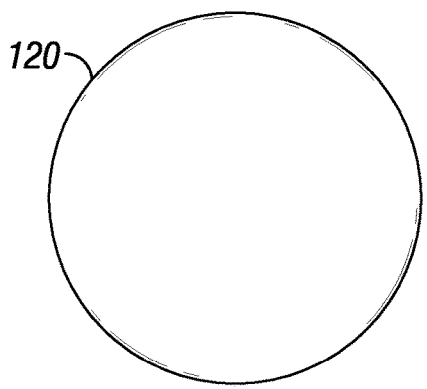
FIG. 6A is a schematic of tape that may be used to support a semiconductor device and FIG. 6B is a schematic showing a bladder positioned on the tape.
Figure 6B:
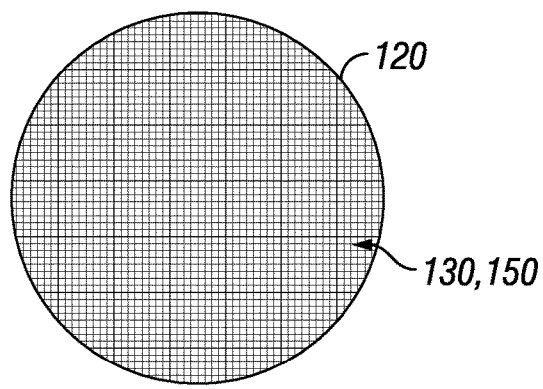

FIG. 6A shows an embodiment of tape 120 that may be used to expand and separate a semiconductor device 110 into a plurality of semiconductor devices, as described herein. FIG. 6B shows a bladder 130 with a plurality of chambers 150 on the tape 120. The pattern created by the bladder 130 and chambers 150 is shown for illustrative purposes and may be varied depending on the application as would be appreciated by one of ordinary skill in the art having the benefit of this disclosure.

Various mechanisms and/or methods may be used to expand the chambers 150, 250 (shown in FIGS. 1-5) of the bladder 130, 250. (shown in FIGS. 1-5) For example, the chambers 150, 250 may contain a material that expands upon heating or the application of ultraviolet light. Various materials may be used to expand the chambers 150, 250 as would be appreciated by one of ordinary skill in the art having the benefit of this disclosure. Expanded polystyrene is an example of a material that expands upon the application of heat. Expanded polystyrene may be a mixture of polystyrene and a gaseous blowing agent, such as, but not limited to, pentane or carbon dioxide. Other materials may be used.

Figure 7:
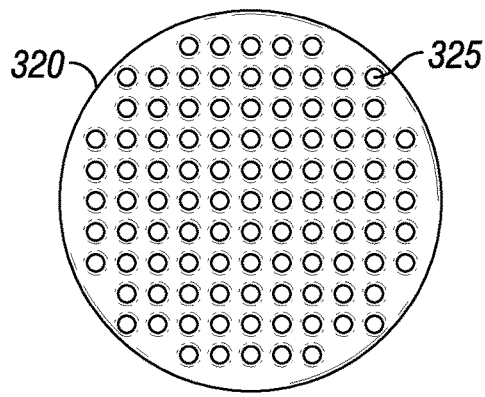
FIG. 7 is a schematic of an embodiment of tape having plurality of holes to permit communication with a plurality of chambers of a bladder.

As yet another example, it may not be necessary to insert a conduit 160 (shown in FIGS. 1-5) through the tape. FIG. 7 shows a schematic of one embodiment of a tape 320 having a plurality of holes or apertures 325 through the tape 320. The holes 325 may enable fluid to be flowed to the chambers 150, 250 to expand the chambers 150, 250 with the use of conduits 160. The holes 325 may be configured to each correspond to a chamber 150, 250 of a bladder 130, 230 positioned on the top surface of the tape 320. Alternatively, the holes 325 may permit the expansion of some, but not all, of the chambers 150, 250 of a bladder 130, 230.

Figure 8:
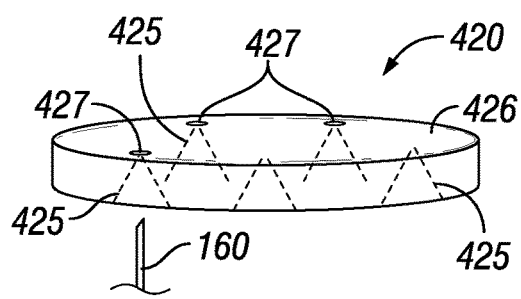
FIG. 8 is a schematic cross-section view of an embodiment of tape having a plurality of structures configured to conduits with a plurality of chambers of a bladder.

FIG. 8 is a schematic cross-section view of an embodiment of tape 420 having a plurality of structures 425 configured to align conduits 160, which may be capillary needles, with a plurality of chambers 150, 250 (shown in FIGS. 1-5) of a bladder 130, 230 (shown in FIGS. 1-5). The structures 425 may be on the bottom surface of the tape 420 or may be positioned within the tape 420 as would be appreciated by one of ordinary skill in the art having the benefit of this disclosure. The structures 425 are configured to align a conduit 160 with a corresponding chamber 150, 250. For example, the structures may be shaped like a funnel to guide the conduit 160 as it is inserted into the tape 420 to create a hole 427 in the top surface 426 of the tape 420 that is aligned with a chamber 150, 250 in an adjacent bladder 130, 230.

After the inserted conduit 160 forms a hole 427 in the top surface 426 of the tape 420, fluid may then flow through the conduit 160 to expand the chamber 150, 250, as described herein. The size, number, shape, and/or configuration of the structures 425 as shown for illustrative purposes and may be varied depending on the application as would be appreciated by one of ordinary skill in the art having the benefit of this disclosure.

Figure 9:
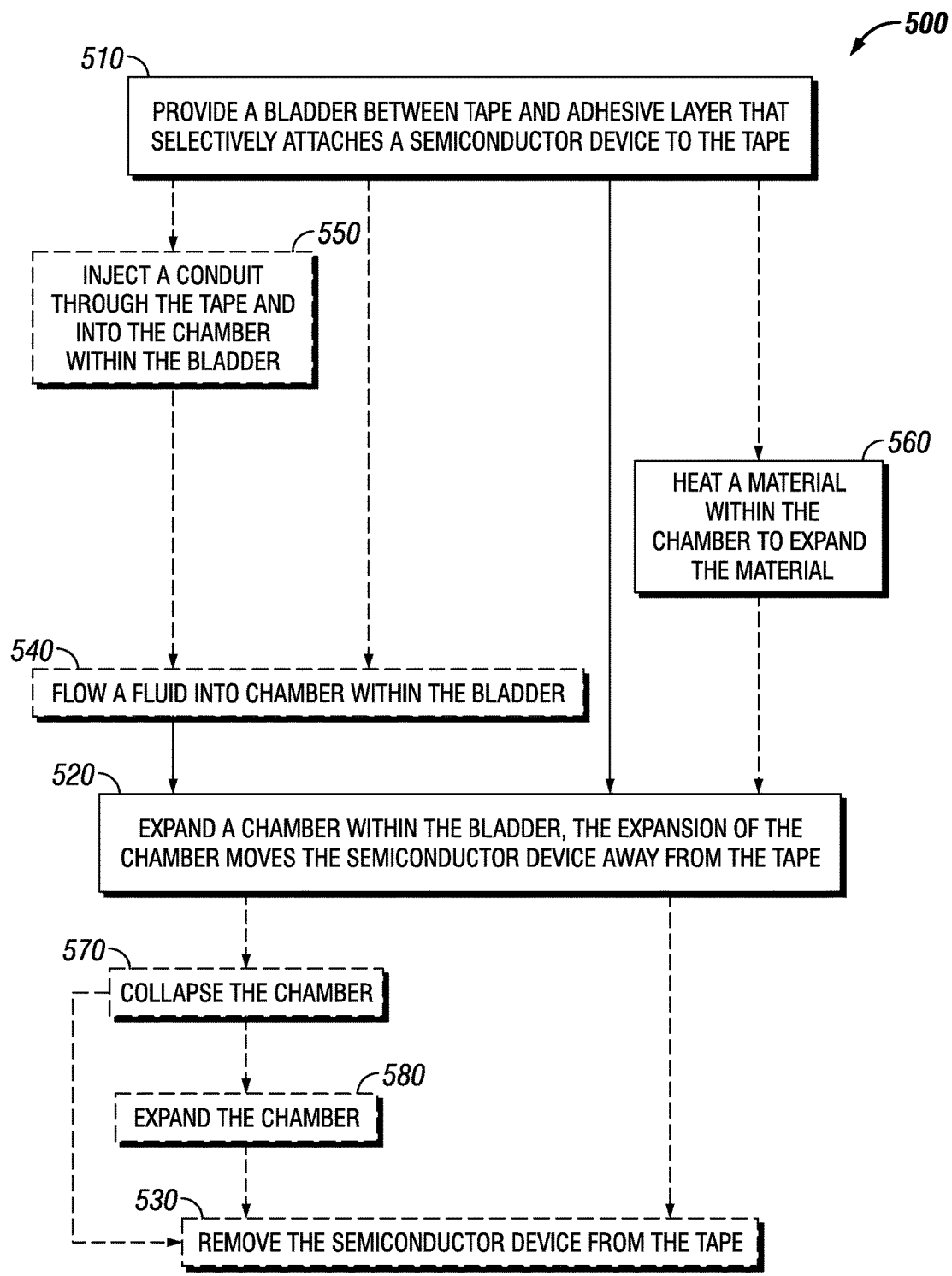
FIG. 9 is a flow chart of a method of removing a semiconductor device from tape.

FIG. 9 is a flow chart of a method 500 of removing a semiconductor device from tape. At 510, the method 500 includes providing a bladder between tape and an adhesive layer that selectively attaches a semiconductor device to the tape. The method includes expanding a chamber within the bladder, the expansion of the chamber moving the semiconductor device away from the tape, at 520. Various methods may be used to expand the chamber within the bladder as would be appreciated by one of ordinary skill in the art having the benefit of this disclosure. For example, the method 500 may include heating a material within the chamber to expand the material, at 560, thus, expanding the chamber. The method 500 may include injecting a conduit through the tape and into the chamber within the bladder, at 550, and flowing a fluid into the chamber within the bladder, at 540.

The method 500 may include removing the semiconductor device from the tape, at 530. The semiconductor device may be removed after expanding the chamber within the bladder. The method 500 may include collapsing the chamber, at 570, after expanding the chamber then removing the semiconductor device from the tape, at 530. The method 500 may include expanding the chamber, at 580, after collapsing the chamber, at 570, and then removing the semiconductor device from the tape, at 530, after expanding the chamber the second time. As discussed herein, various methods may be used to expand and collapse a chamber within a bladder.

The method 500 may include cycling the chamber between an expanded state and a collapsed state until the semiconductor device can be removed from the tape. The conduit may be used to flow fluid into the chamber and also to withdraw fluid from the chamber to repeatedly expand and cycle the chamber. Other methods may be used to expand and collapse the chamber as would be appreciated by one of ordinary skill in the art having the benefit of this disclosure.

Although this disclosure has been described in terms of certain embodiments, other embodiments that are apparent to those of ordinary skill in the art, including embodiments that do not provide all of the features and advantages set forth herein, are also within the scope of this disclosure. The disclosure may encompass other embodiments not expressly shown or described herein. Accordingly, the scope of the present disclosure is defined only by reference to the appended claims and equivalents thereof.

What is claimed is:

1. An apparatus comprising:
   tape;

an adhesive layer configured to selectively connect the tape to a semiconductor device; and a bladder positioned between the tape and the adhesive layer, the bladder having a plurality of chambers configured to be selectively expanded, wherein the expansion of the plurality of chambers moves portions of the bladder and adhesive layer away from the tape.

2. The apparatus of claim 1, wherein a flow of a fluid into each of the plurality of chambers selectively expands each of the plurality of chambers.

3. The apparatus of claim 2, wherein the fluid comprises one of air, nitrogen, or oxygen.

4. The apparatus of claim 1, wherein the portions of the bladder are thermally bonded to the tape to create the plurality of chambers.

5. The apparatus of claim 1, wherein the plurality of chambers when expanded have a substantially rounded upper profile.

6. The apparatus of claim 1, wherein the plurality of chambers when expanded have a substantially pointed upper profile.

7. The apparatus of claim 1, each chamber of the plurality of chambers containing a material, wherein heat applied to the material selectively expands each of the plurality of chambers.

8. The apparatus of claim 7, wherein the material comprises polystyrene and a gaseous blowing agent.

9. The assembly of claim 1, the tape comprising a plurality of holes, wherein the flow of a fluid through the plurality of holes selectively expands each of the plurality of chambers.

10. A system comprising:
tape;
an adhesive layer configured to selectively connect the tape to a semiconductor device; and
a bladder positioned between the tape and the adhesive layer, the bladder having a plurality of chambers configured to be selectively expanded, wherein the expansion of the plurality of chambers moves portions of the bladder and adhesive layer away from the tape; and
a plurality of conduits configured to provide a fluid to expand each of the plurality of chambers.

11. The system of claim 10, wherein each of the plurality of conduits are configured to be inserted through the tape into respective chambers of the plurality of chambers.

12. The system of claim 11, wherein the plurality of conduits are configured to create a hole in the tape.

13. The system of claim 12, the tape further comprising a plurality of structures configured to align each of the plurality of conduits with one chamber of the plurality of chambers.

14. The system of claim 13, wherein the plurality of structures are on a bottom surface of the tape.

15. A method of removing a semiconductor device from tape comprising:
providing a bladder between tape and an adhesive layer, the adhesive layer selectively attaching the semiconductor device to the tape; and
expanding a chamber within the bladder, wherein the expansion of the chamber moves the semiconductor device away from the tape.

16. The method of claim 15, further comprising removing the semiconductor device from the tape.

17. The method of claim 15, wherein expansion of the chamber within the bladder further comprises flowing a fluid into the chamber.

18. The method of claim 17, further comprising injecting a conduit through the tape and into the chamber and wherein flowing the fluid into the chamber further comprises flowing the fluid through the conduit into the chamber.

19. The method of claim 15, wherein expanding the chamber within the bladder further comprises heating a material within the chamber to expand the material.

20. The method of claim 15, further comprising collapsing the chamber after expanding the chamber.

21. The method of claim 20, further comprising removing the semiconductor device from the tape.

22. The method of claim 20, further comprising expanding the chamber a second time after collapsing the chamber.

23. The method of claim 22, further comprising removing the semiconductor device from the tape.

* * * * *

UNITED STATES PATENT AND TRADEMARK OFFICE
CERTIFICATE OF CORRECTION

PATENT NO. : 10,043,688 B1
APPLICATION NO. : 15/867071
DATED : August 7, 2018
INVENTOR(S) : Jeremy E. Minnich et al.

Page 1 of 1

It is certified that error appears in the above-identified patent and that said Letters Patent is hereby corrected as shown below:

In the Claims

Claim 5 should read as:
5. The apparatus of claim 1, wherein the plurality of chambers when expanded have a substantially rounded profile.

Claim 6 should read as:
6. The apparatus of claim 1, wherein the plurality of chambers when expanded have a substantially pointed profile.

Signed and Sealed this
Twenty-sixth Day of February, 2019

Andrei Iancu
*Director of the United States Patent and Trademark Office*